(12) United States Patent
Vianello et al.

(10) Patent No.: US 12,170,109 B2
(45) Date of Patent: Dec. 17, 2024

(54) HYBRID RESISTIVE MEMORY

(71) Applicant: Commissariat à l'Energie Atomique et aux Energies Alternatives, Paris (FR)

(72) Inventors: Elisa Vianello, Grenoble (FR); Jean-François Nodin, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 34 days.

(21) Appl. No.: 17/454,311

(22) Filed: Nov. 10, 2021

(65) Prior Publication Data
US 2022/0148653 A1      May 12, 2022

(30) Foreign Application Priority Data
Nov. 12, 2020    (EP) .................................... 20306367

(51) Int. Cl.
*G11C 13/00*     (2006.01)
*H10B 63/00*     (2023.01)
*H10N 70/00*     (2023.01)
*H10N 70/20*     (2023.01)

(52) U.S. Cl.
CPC ...... *G11C 13/0004* (2013.01); *G11C 13/0011* (2013.01); *H10B 63/30* (2023.02); *H10N 70/021* (2023.02); *H10N 70/231* (2023.02); *G11C 2213/79* (2013.01)

(58) Field of Classification Search
CPC ............ G11C 13/0004; G11C 13/0011; G11C 2213/79; G11C 11/005; G11C 11/22; G11C 13/0007; H10B 63/30; H10B 53/30; H10B 63/80; H10B 63/84; H10N 70/021; H10N 70/231; H10N 70/24; H10N 70/245; H10N 70/826; H10N 70/8828; H10N 70/8833
USPC .................................................. 365/148, 158
See application file for complete search history.

(56) References Cited

U.S. PATENT DOCUMENTS

| | | | |
|---|---|---|---|
| 9,349,447 B1* | 5/2016 | Trent | G11C 11/1655 |
| 9,711,718 B1* | 7/2017 | Bedau | H10N 70/8833 |
| 10,497,433 B2* | 12/2019 | Lee | H10B 63/30 |
| 10,784,312 B1* | 9/2020 | Kabuyanagi | G11C 13/003 |
| 2009/0147564 A1* | 6/2009 | Lung | H10N 70/041 |
| | | | 438/102 |
| 2010/0084702 A1* | 4/2010 | Fukuda | H10B 41/42 |
| | | | 257/E27.103 |

(Continued)

FOREIGN PATENT DOCUMENTS

| | | | |
|---|---|---|---|
| CN | 107039059 A * | 8/2017 | G06F 12/0638 |
| WO | WO-2018125038 A1 * | 7/2018 | G11C 5/063 |

OTHER PUBLICATIONS

IBM (IBM) issued patent titled "Compact resistive random access memory integrated with a pass gate transistor", Oct. 21, 2021, News Bites—Computing & Information, all pages. (Year: 2021).*

(Continued)

*Primary Examiner* — Michael T Tran
(74) *Attorney, Agent, or Firm* — Jordan IP Law, LLC

(57) ABSTRACT

The present disclosure relates to a memory circuit comprising: a transistor layer; a plurality of first memory elements positioned in a first level above the transistor layer; and a plurality of filament switching resistive memory elements positioned in a second level higher than the first level.

11 Claims, 3 Drawing Sheets

(56) References Cited

U.S. PATENT DOCUMENTS

| | | | |
|---|---|---|---|
| 2013/0077382 A1* | 3/2013 | Cho | G11C 7/10 365/163 |
| 2013/0201777 A1* | 8/2013 | Shin | G11C 11/402 365/222 |
| 2013/0341581 A1* | 12/2013 | Ritter | G01K 7/01 257/2 |
| 2015/0249096 A1* | 9/2015 | Lupino | H01L 27/11898 257/203 |
| 2015/0255511 A1* | 9/2015 | Takagi | G11C 5/06 365/63 |
| 2015/0255513 A1* | 9/2015 | Nakakubo | G11C 13/0007 257/4 |
| 2016/0267972 A1* | 9/2016 | Tanaka | G11C 13/003 |
| 2017/0140820 A1* | 5/2017 | Shih | H10B 63/24 |
| 2018/0108383 A1* | 4/2018 | Kim | G11C 5/06 |
| 2019/0164834 A1* | 5/2019 | Or-Bach | H01L 21/6835 |
| 2019/0363087 A1* | 11/2019 | Zhou | H10B 63/80 |
| 2019/0363131 A1* | 11/2019 | Torng | G06N 3/08 |
| 2019/0378790 A1* | 12/2019 | Bohr | H01L 21/823481 |
| 2019/0386062 A1* | 12/2019 | Wang | H10B 61/22 |
| 2020/0075728 A1* | 3/2020 | Sato | H10B 41/41 |
| 2020/0185392 A1* | 6/2020 | Makosiej | G11C 5/063 |
| 2020/0227519 A1* | 7/2020 | Song | H01L 29/66969 |
| 2020/0274063 A1* | 8/2020 | Furuhashi | G11C 13/0069 |
| 2020/0286955 A1* | 9/2020 | Cheng | H01L 21/02639 |
| 2020/0294594 A1* | 9/2020 | Kimura | G11C 16/14 |
| 2020/0349993 A1* | 11/2020 | Oka | G11C 11/1675 |
| 2020/0395408 A1* | 12/2020 | Takahashi | H10B 63/845 |
| 2020/0411428 A1* | 12/2020 | Lilak | H01L 23/5226 |
| 2021/0327505 A1* | 10/2021 | Li | G11C 13/004 |
| 2021/0342678 A1* | 11/2021 | Mostafa | G06N 3/063 |
| 2022/0059175 A1* | 2/2022 | Suzuki | G11C 16/08 |
| 2022/0148653 A1* | 5/2022 | Vianello | H10N 70/231 |
| 2022/0208856 A1* | 6/2022 | Tan | H01L 29/78669 |
| 2022/0285613 A1* | 9/2022 | Wu | H10N 70/021 |
| 2023/0012748 A1* | 1/2023 | Billoint | G11C 13/004 |
| 2023/0069683 A1* | 3/2023 | Suzuki | G11C 16/10 |
| 2023/0072287 A1* | 3/2023 | Chou | G11C 13/004 |
| 2023/0122500 A1* | 4/2023 | Inaba | G11C 5/063 257/213 |
| 2023/0200091 A1* | 6/2023 | Loy | H01L 23/5226 257/390 |
| 2023/0223469 A1* | 7/2023 | Or-Bach | H10B 10/12 |
| 2023/0307359 A1* | 9/2023 | Watanabe | H10B 43/50 |

OTHER PUBLICATIONS

IBM Granted United States Patent for Stacked Resistive Random Access Memory with Integrated Access Transistor and High Density Layout, Sep. 8, 2020, Global IP News. Semiconductor Patent News, all pages. (Year: 2020).*

European Search Report for European Application No. 20306367, dated Apr. 16, 2021, 2 pages.

* cited by examiner

HYBRID RESISTIVE MEMORY

FIELD

The present invention relates generally to the field of integrated circuits, and in particular to resistive memories, and to methods of forming the same.

BACKGROUND

Resistive memories are memories that are formed of resistive devices that can be programmed to have two or more different resistive states in order to store one or more bits of data. The programming is usually made by passing a programming current through at least part of the device, or applying a programming voltage across at least part of the device. Depending on the particular technology, the resistive state depends on the level or polarity of the programming current or voltage, or on the form or duration of the current pulse. An advantage of resistive memories is that the data can be stored in a non-volatile fashion, meaning that a programmed resistive state is maintained even if a power supply to the memory is interrupted.

The particular properties of a resistive memory, such as the duration of data retention, the amount of drift over time, the robustness of the programmed state, etc., vary significantly from one technology to another. However, for certain applications, there can be a need for a memory having a combination of properties that are not available from a single memory technology.

SUMMARY

It is an aim of embodiments of the present disclosure to at least partially address one or more needs in the prior art.

According to one aspect, there is provided a memory circuit comprising: a transistor layer; a plurality of first memory elements positioned in a first level above the transistor layer; and a plurality of filament switching resistive memory elements, for example of a different type to the first memory elements, positioned in a second level higher than the first level.

According to one embodiment, the plurality of first memory elements comprises:
one or more phase change memory elements; and/or
one or more ferroelectric tunnel junction memory elements; and/or
one or more oxide random access memory elements; and/or
one or more static random-access memory elements; and/or
one or more dynamic random-access memory elements.

According to one embodiment, the plurality of filament switching resistive memory elements comprises one or more conductive bridging memory elements and/or one or more oxide random access memory elements.

According to one embodiment, the first level is positioned directly on the transistor layer.

According to one embodiment, the first memory elements and the filament switching resistive memory elements are positioned in different levels of a same region of the device.

According to one embodiment, the memory circuit further comprising at least one first interconnection level dedicated to the routing of the first memory elements and at least one second interconnection level dedicated to the routing of the filament switching resistive memory elements.

According to one embodiment, the plurality of first memory elements are positioned in a first region of the circuit, and the plurality of filament switching resistive memory elements are positioned in a second region of the circuit, there being no overlap between the first and second regions.

According to one embodiment, the memory circuit further comprises at least one interconnection level comprising: in a region aligned with the first region, routing tracks that are dedicated to the first memory elements; and in a region aligned with the second region, routing tracks that are dedicated to the filament switching memory elements.

According to one embodiment, the second level is directly above the first level.

According to a further aspect, there is provided a method of fabrication of a resistive memory circuit comprising:
forming a transistor layer of the resistive memory circuit;
forming a plurality of first memory elements in first level above the transistor layer; and
forming a plurality of filament switching resistive memory elements in a second level higher than the first level.

According to one embodiment, the plurality of first memory elements comprises:
one or more phase change memory elements; and/or
one or more ferroelectric tunnel junction memory elements; and/or
one or more oxide random access memory elements; and/or
one or more static random-access memory elements; and/or
one or more dynamic random-access memory elements.

According to one embodiment, the plurality of filament switching resistive memory elements comprises one or more conductive bridging memory elements and/or one or more oxide random access memory elements.

According to one embodiment, the first level is formed directly on the transistor layer.

According to one embodiment, the first memory elements and the filament switching resistive memory elements are formed in different levels of a same region of the device.

According to one embodiment, forming the plurality of first memory elements comprising forming the first memory elements in a first region of the circuit, and forming the plurality of filament switching resistive memory elements comprises forming the filament switching resistive memory elements in a second region of the circuit, there being no overlap between the first and second regions.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. For example, the particular process steps for the formation of specific technologies of resistive memory elements has not been detailed, such processes being well known to those skilled in the art. Furthermore, the circuitry for programming and reading resistive elements has not been detailed, the solutions described herein being compatible with conventional circuitry well known to those skilled in the art.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
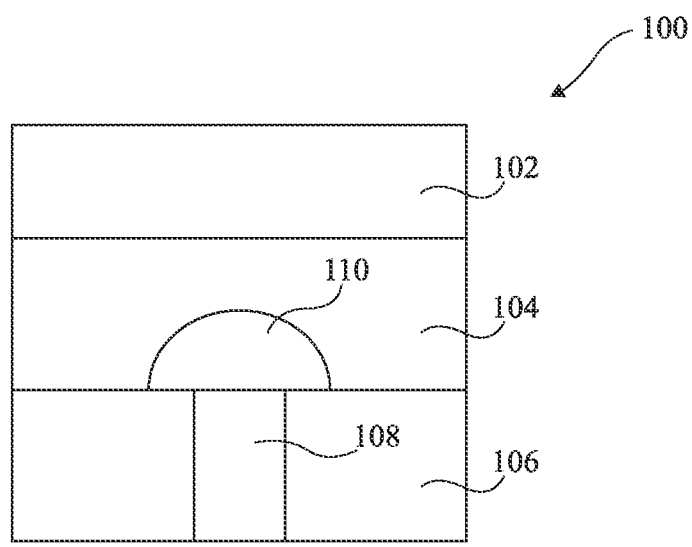
FIG. 1 is a cross-section view of a phase change memory element according to an example embodiment.

FIG. 1 is a cross-section view of a phase change memory (PCM) element 100 according to an example embodiment. The element 100 for example comprises a top electrode 102, a layer 104 of a phase change material for example in contact with the top electrode 102, and a heater element 108, this heating element also for example forming a bottom electrode of the PCM element 100, and being in contact with the layer 104. The heating element 108 is for example of a metal, such as Ti, TiN, or W, and is for example laterally surrounded by a dielectric material 106.

The phase change material for example comprises, or is formed entirely of, a GST material, that is a material comprising germanium (Ge), antimony (Sb) and tellurium (T).

The electrode 102 and heater 108 are each for example made of a metal such as tungsten, or an alloy comprising titanium.

The phase change material of the layer 104 has the capacity to switch between an amorphous state and a crystalline state under heating resulting from a programming current applied between the electrodes 102, 108. A volume 110 of the layer 104 is for example subject to this phase switching. Switching this volume 110 from the amorphous state to the crystalline state is generally known as a SET operation, the resulting crystalline state being associated with a relatively low electrical resistance between the electrodes 102, 108. Switching the volume 110 from the crystalline state to the amorphous state is generally known as a RESET operation, the resulting amorphous state being associated with a relatively high resistance between the electrodes 102, 108. During reading of the element 100, its resistance is for example detected in order to determine the programmed state of the element 100, this for example being achieved by passing a current though the element 100 and measuring a voltage across it, or by applying a voltage across the element 100 and measuring a current passing through it.

Figure 2:
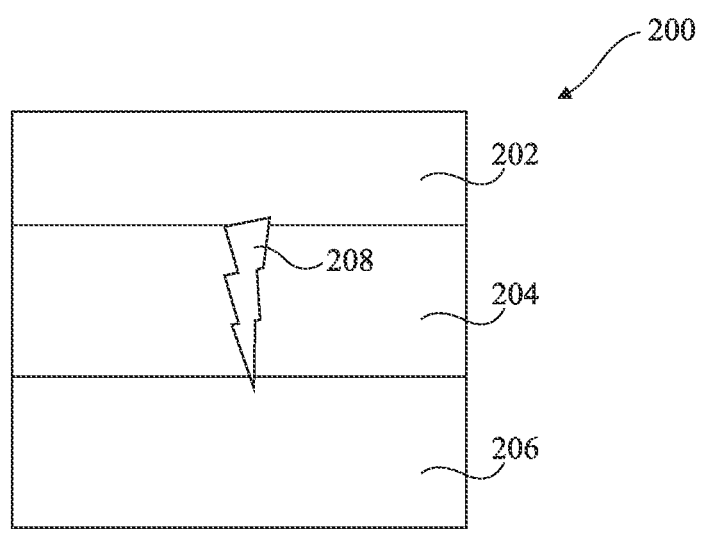
FIG. 2 is a cross-section view of a filament switching memory element according to an example embodiment.

FIG. 2 is a cross-section view of a filament switching memory element 200 according to an example embodiment. The element 200 for example comprises a top electrode 202, a layer 204 of a filament forming material in contact with the top electrode 202, and a bottom electrode 206, which is in contact with the layer 204. The filament forming material of the layer 204 is a layer of insulator, forming an electrolyte.

In one embodiment, the element 200 is of the type known in the art as OxRAM (Oxide RAM). In such a case, the top electrode 202 is for example formed of Ti, of Ta, or of W, the layer 204 is formed of $Ta_2O_5$, $SiO_2$, or $HfO_2$, and the bottom electrode 206 is formed of TaN or TiN, although it should be noted that these lists of materials are non-exhaustive, and other materials would be possible for each electrode/layer.

In another embodiment, the element 200 is of the type known in the art as CBRAM (Conductive Bridging RAM). In such a case, the top electrode 202 is for example formed of Ag or Cu, or of an alloy containing Si or Cu, the layer 204 is formed of $SiO_2$, $Al_2O_3$, $HfO_3$, $Ta_2O_5$, or a chalcogenide material, and the bottom electrode 206 is formed of TiN or TaN. Again, it should be noted that these lists of materials are non-exhaustive, and other materials would also be possible for each electrode/layer. A difference with respect to OxRAM elements is that CBRAM elements are based on migration of a soluble ion, such as Cu, Ag, or another soluble ion, whereas OxRAM elements are based on the migration of oxygen vacancies.

Whatever the particular type of filament switching element, prior to any programming operation, the element 200 is for example in an initial resistive state (IRS). A process known as "forming" or "electroforming" involves applying a biasing voltage across the electrodes of the element 200 to cause a transition from the IRS state to a low resistance state (LRS). During this forming step, a filament 208 is for example formed for the first time.

Thereafter, the element 200 can for example be made to toggle between the low resistance state and a high resistance state (HRS), these states being respectively associated with distinguishable low and high resistance values in order to provide binary data storage. In particular, a transition from the LRS state to the HRS state is generally referred to as a RESET operation, and the HRS state is generally considered to correspond to a logic "0" state or OFF state. A transition from the HRS state to the LRS state is generally referred to as a SET operation, and the LRS state is generally considered to correspond to a logic "1" state or ON state.

Transitioning from the IRS or HRS state to the LRS state involves applying a biasing voltage VBIAS across the resistive-switching element 100 in order to form a filament 202 across the insulating layer 102. This filament forms a conducting path between the electrodes 104, 106, thereby creating a relatively low-resistance filament between the electrodes.

Transitioning from the LRS state to the HRS state involves at least partially dissolving the filament 202 such that there is no longer a low resistance path between the electrodes 104, 106 of the device. In some cases, the filament may self-dissolve, while in other cases, the filament is caused to dissolve by applying a biasing voltage VBIAS of opposite polarity to the one used for the SET operation.

The particular mechanism that causes the creation and dissolution of the filament across the insulating layer 204 depends on the particular technology of the resistive-switching element, and will not be described in detail herein. For example, conductive bridge RAM is described in more detail in the publication by D. Jana et al. entitled "Conductive-bridging random access memory: challenges and opportunity for 3D architecture", Nanoscale Research Letters, 2015. Oxide Random Access Memory is for example described in more detail in the publication by H.S. Philip Wong et al. entitled "Metal-Oxide RRAM", Proceedings of the IEEE, 2012.

In the following description, embodiments of a hybrid memory comprising PCM elements and OxRAM memory elements will be described.

However, the PCM elements could be replaced by another type of memory element, which may or may not be a resistive memory element. For example, in some embodiments, at least some of the PCM elements are replaced by one or more ferroelectric tunnel junction (FTJ) memory elements. An FTJ element is another type of resistive memory cell that is based on a thin ferroelectric layer sandwiched between metal electrodes. The electrical resistance of an FTJ element depends on the orientation of the polarization of the ferroelectric layer, and this orientation can for example be switched by an applied electric field. Additionally or alternatively, one or more of the PCM elements could be replaced by oxide random access memory elements, and/or static random-access memory (SRAM) elements; and/or dynamic random-access memory (DRAM) elements.

Similarly, the OxRAM memory elements could be replaced by another type of filament switching element, such as a CBRAM element as described above.

Figure 3:
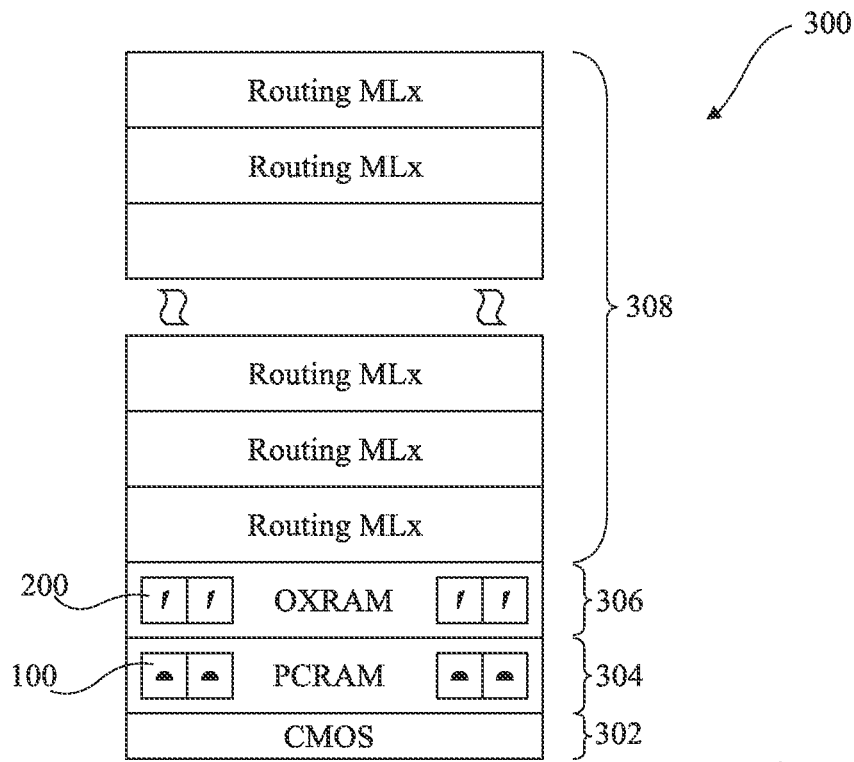
FIG. 3 schematically represents a cross-section of a portion of a hybrid memory device according to an example embodiment of the present disclosure.

FIG. 3 schematically represents a cross-section of a portion 300 of a hybrid memory device according to an example embodiment of the present disclosure. A CMOS (Complementary Metal Oxide Semiconductor) layer 302, which will be referred to herein as the transistor layer, for example comprises n-channel and p-channel MOS transistors formed on and in a semiconductor substrate (not illustrated), for example formed of silicon. PCM elements (PCRAM) 100 are formed in a first interconnection level 304 formed over the CMOS layer 302, the first level being the level formed directly on the transistor layer 302. As known by those skilled in the art, the interconnection levels, sometimes called metal layers, or metal 1 (M1), metal 2 (M2) etc., are the levels of the device comprising metal routing tracks, for example for interconnecting nodes of the transistor layer 302. OxRAM elements (OXRAM) 200 are formed in a second interconnection level 306 formed over the level 304, and for example directly above the level 304. A plurality of further interconnection levels (Routing MLx) 308 are positioned above the OxRAM level 306, and comprise, for example, routing tracks for routing the PCRAM elements 100 of the level 304, and the OxRAM elements 200 of the level 306, to the other circuitry of the hybrid memory, such as to programming circuits and/or read circuits (not illustrated).

The arrangement of the PCRAM level 304 and of the OxRAM level 306 of FIG. 3 has certain advantages. The lower interconnection levels closest to the front end, such as the lowest level directly over the transistor layer 302, permit a more aggressive lithography process, which for example allows the dimensions (e.g. the critical dimension CD) of the heater to be reduced, which in turn permits a reduction in the programming current. Reducing the dimensions of other types of memory elements by forming them in one of the lower levels is also advantageous for memory compactness. Furthermore, in the case of an FTJ element, there is a further advantage with forming such elements in the lower interconnection levels. Indeed, such a technology involves a high fabrication temperature, for example of over 450° C., and once this level has been formed, the process temperature is then reduced in the back-end-of-line independently of the integration of the filament switching memory elements, which involve lower fabrication temperatures. Furthermore, filament switching elements, such as OxRAM and CBRAM, do not have specific process integration constraints in terms of lithography.

Figure 4:
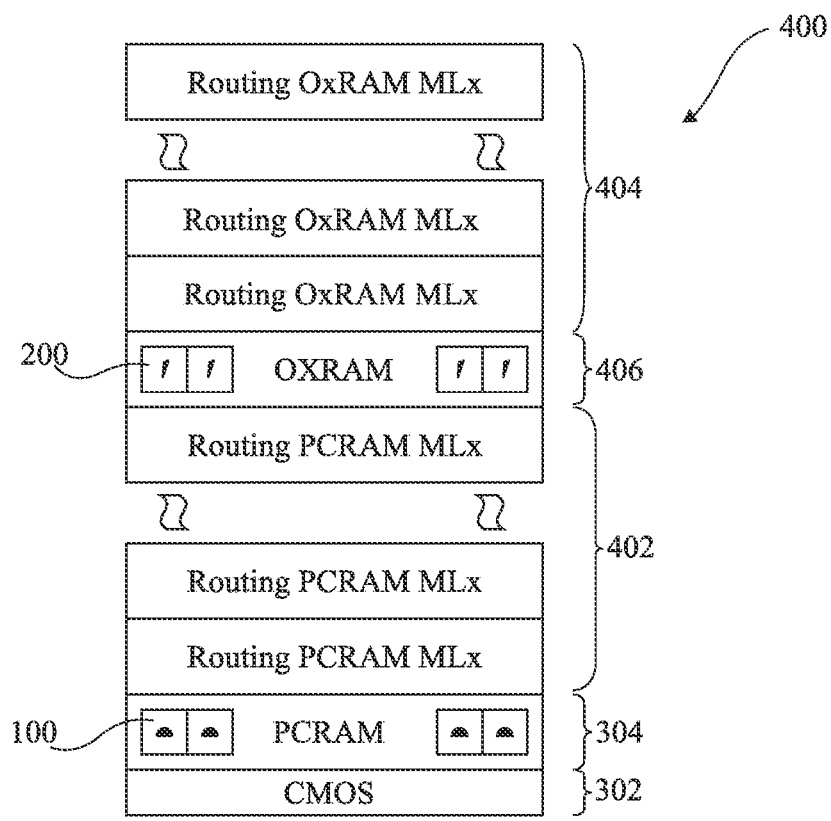
FIG. 4 schematically represents a cross-section of a portion of a hybrid memory device according to a further example embodiment of the present disclosure.

FIG. 4 schematically represents a cross-section of a portion 400 of a hybrid memory device according to a further example embodiment of the present disclosure. There are similarities with the embodiment of FIG. 3, and like the portion 300, in the portion 400, the first two layers are the CMOS layer 302 and PCRAM level 304. However, rather than the OxRAM level 306 being positioned directly over the PCRAM layer 304, there are instead one or more interconnection levels 402 (Routing PCRAM MLx) formed directly above the PCRAM level 304 and which are for example dedicated to providing routing between the PCRAM elements of the PCRAM level 304 and the other circuitry of the hybrid memory, such as to programming circuits and/or read circuits (not illustrated). The OxRAM level 306 is for example formed directly above an uppermost level of the interconnection levels 402. One or more further interconnection levels (Routing OxRAM MLx) 404 are formed above the OxRAM level 306. The levels 404 are for example dedicated to providing routing between the OxRAM elements of the OxRAM level 306 and the other circuitry of the hybrid memory, such as to programming circuits and/or read circuits.

Figure 5:
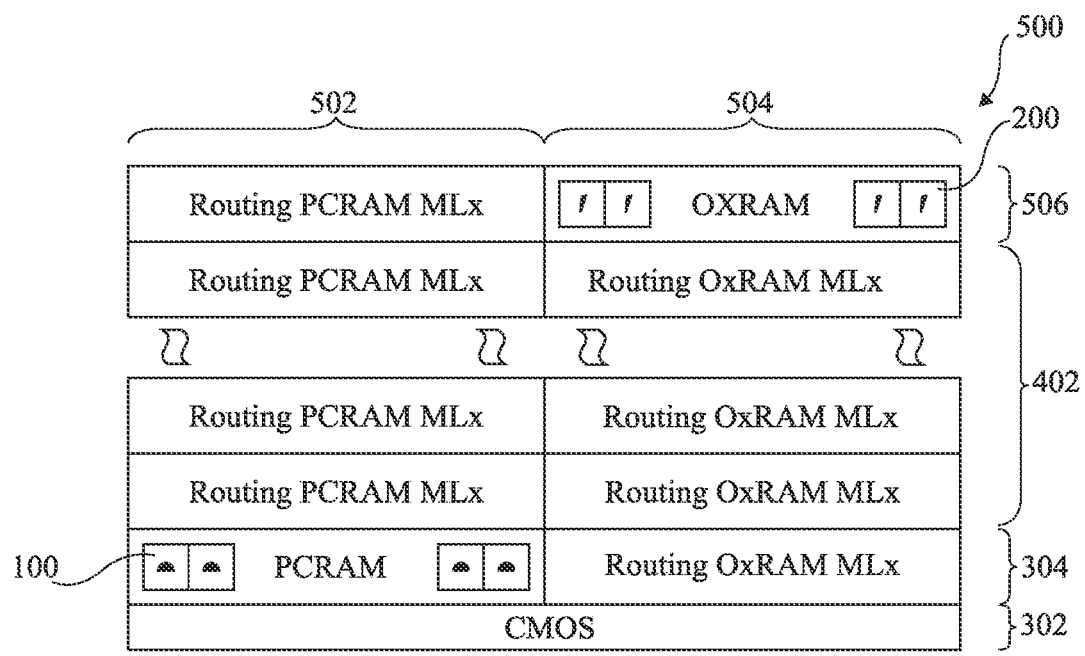
FIG. 5 schematically represents a cross-section of a portion of a hybrid memory device according to yet a further example embodiment of the present disclosure.

FIG. 5 schematically represents a cross-section of a portion 500 of a hybrid memory device according to a further example embodiment of the present disclosure. In the embodiment of FIG. 5, the interconnection level 304 directly above the CMOS layer 302 for example comprises PCRAM elements 100 in a region 502, and OXRAM routing tracks (Routing OxRAM MLx) in a region 504, the regions 502 and 504 for example being adjacent to each other. The OxRAM elements 200 are formed in the region 504 of a different interconnection level 506 to that of the PCRAM elements 100. For example, the interconnection level 506 is a top interconnection of the device, or any interconnection level higher than the level 304. The one or more interconnection levels 402 are formed directly above the level 304, and for example comprise, in the region 502, routing tracks (Routing PCRAM MLx) dedicated to providing routing between the PCRAM elements 100 of the level 304 and the other circuitry of the hybrid memory, such as to programming circuits and/or read circuits (not illustrated), and in the region 504, routing tracks (Routing OxRAM MLx) dedicated to providing routing between the OXRAM elements 200 of the level 304 and the other circuitry of the hybrid memory, such as to programming circuits and/or read circuits (not illustrated). Furthermore, the region 502 of the layer 506 also for example comprises PCRAM routing tracks.

In alternative embodiments to that of FIG. 5, the PCRAM elements 100 could be formed in another layer that is not directly above the CMOS layer 302, but which is for example below the layer 506 in which the OXRAM elements are formed. An example of such an embodiment will now be described with reference to FIG. 6.

Figure 6:
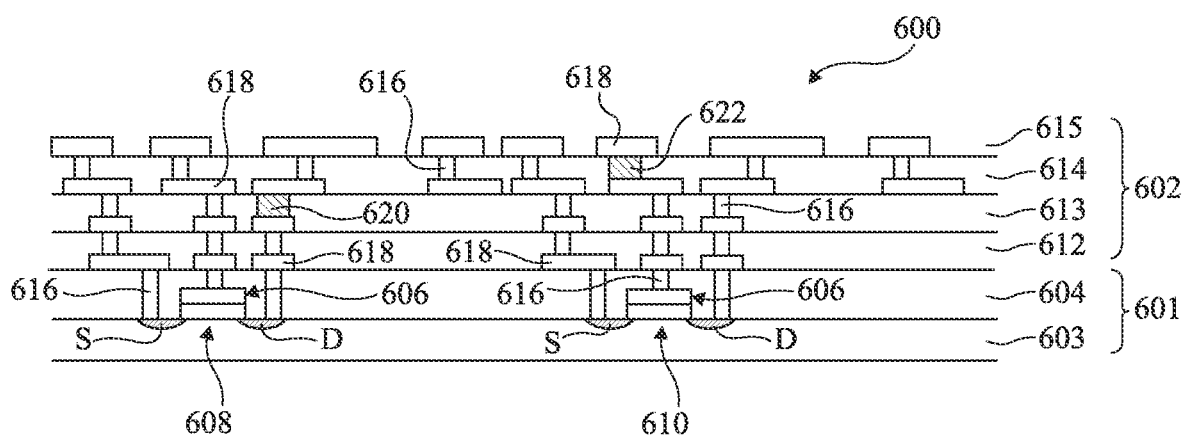
FIG. 6 is a cross-section view of a portion of a memory device according to an example embodiment of the present disclosure.

FIG. 6 is a cross-section view illustrating a portion 600 of a memory device, and showing in particular an example of the co-integration of two types of resistive memory devices.

The device 600 for example comprises a transistor layer 601 corresponding to the CMOS layer 302 of FIGS. 3 to 6, and a metal stack 602 comprising the interconnection levels of the device.

The transistor layer 601 is formed of a top region 603 of a silicon substrate in which transistor sources and drains S, D, are formed, and a transistor gate layer 604 in which gate stacks 606 of the transistors are formed. Two transistors 608, 610 are illustrated in the example of FIG. 6.

The metal stack 602 comprises four interconnection levels 612, 613, 614 and 615 in the example of FIG. 6, each interconnection level for example comprising a patterned metal layer 618 and metal vias 616 coupling metal layers, surrounded by a dielectric material. Furthermore, metal vias 616 for example extend from the source, drain and gate contacts of the transistors 608, 610 to the metal layer 618 of the interconnection level 612.

In the example of FIG. 6, a memory device 620, for example of the PCRAM or FTJ type, is formed in the interconnection level 613, and for example extends between the metal layers 618 of the interconnection levels 613 and 614.

A filament switching resistive memory device 622, for example of the OXRAM or CBRAM type, is formed in the interconnection level 614, and for example extends between the metal layers 618 of the interconnection levels 614 and 615.

A method of fabricating a resistive memory circuit comprising any of the portions 300 to 600 of FIGS. 3 to 6 for example involves forming the CMOS layer 302 prior to sequentially forming each of the interconnection levels from the bottom to the top.

A method of fabricating a resistive memory circuit comprising any of the portions 300 to 600 of FIGS. 3 to 6 for example involves:

forming the transistor layer 302, 601 of the resistive memory circuit, for example on and in a semi-conductor substrate, such as a silicon substrate;

forming a plurality of first memory elements 100, 620 in first level 304, 613 above the transistor layer, in some cases this first level being the level directly above the transistor layer; and forming a plurality of filament switching resistive memory elements 200, 622 in a second level 306, 406, 502, 614 higher than the first level.

The method also for example involves either:

forming the interconnection levels 402 dedicated to the routing of the memory elements 100 and interconnection levels 404 dedicated to the routing of the filament switching resistive memory elements; or forming the interconnection levels 402 comprising, in a region 502, routing tracks that are dedicated to the memory elements 100, and in a region 504, routing tracks that are dedicated to the filament switching memory elements 200.

An advantage of the embodiments described herein is that a device is capable of integrating two types of memory devices, thereby benefiting from the combination of properties of these devices that are not available from a single technology of resistive memory. For example, it is possible to combine, in a same structure, restive memory elements with other types of memory elements, or both volatile and non-volatile resistive memory elements.

Furthermore, there are particular advantages associated with the embodiments of FIGS. 4 and 5, in which the level 304 of the memory elements 100 is separated from the level 406 or 506 of the memory elements 200 by at least one interconnection level. For example, during the manufacturing process of such structures, it is possible to avoid the use of a mask, used for forming the memory devices 200 of the level 406 or 506, deposited directly on the memory devices 100 of the level 304. Indeed, such a mask is deposited instead on the interconnection level. Furthermore, standard memory fabrication processes can be employed.

Various embodiments and variants have been described. Those skilled in the art will understand that certain features of these embodiments can be combined and other variants will readily occur to those skilled in the art. In particular, while examples of certain types of memory elements and filament switching resistive memories have been described, it will be apparent to those skilled in the art that the principles described herein could be applied to other types. Furthermore, while in the described embodiments the lowest level in which memory devices are formed is a first interconnection level, it would also be possible to form memory elements below the metal 1 (M1) level, i.e. between the transistor contact and the first interconnection level.

What is claimed is:

1. A memory circuit comprising:
   a transistor layer;
   a plurality of first memory elements positioned in a first level above the transistor layer;
   a plurality of filament switching resistive memory elements positioned in a second level higher than the first level, wherein the first memory elements and the filament switching resistive memory elements are positioned in different levels of a same region of the device;
   at least one first interconnection level separating the first and second levels, wherein the at least one first interconnection level is dedicated to the routing of the first memory elements; and
   at least one second interconnection level, separating the first and second levels or being higher than the second level, dedicated to the routing of the filament switching resistive memory elements.

2. The memory circuit of claim 1, wherein the plurality of first memory elements comprises:
   one or more phase change memory elements; and/or
   one or more ferroelectric tunnel junction memory elements; and/or
   one or more oxide random access memory elements.

3. The memory circuit of claim 1, wherein the plurality of filament switching resistive memory elements comprises one or more conductive bridging memory elements and/or one or more oxide random access memory elements.

4. The memory circuit of claim 1, wherein the first level is positioned directly on the transistor layer.

5. A method of fabrication of a resistive memory circuit comprising:
   forming a transistor layer of the resistive memory circuit;
   forming at least one first interconnection level;

forming, in a first region of the circuit, a plurality of first memory elements in a first level above the transistor layer; and forming, in a second region of the circuit, a plurality of filament switching resistive memory elements in a second level higher than the first level, there being no overlap between the first and second regions, wherein the at least one first interconnection level separates the first and second levels and is configured to provide routing at least between the first memory elements.

6. The method of claim 5, wherein the plurality of first memory elements comprises:

one or more phase change memory elements; and/or one or more ferroelectric tunnel junction memory elements; and/or one or more oxide random access memory elements.

7. The method of claim 5, wherein the plurality of filament switching resistive memory elements comprises one or more conductive bridging memory elements and/or one or more oxide random access memory elements.

8. The method of claim 5, wherein the first level is formed directly on the transistor layer.

9. A memory circuit comprising:

a transistor layer;

a plurality of first memory elements positioned in a first level above the transistor layer;

a plurality of filament switching resistive memory elements positioned in a second level higher than the first level;

at least one first interconnection level separating the first and second levels, wherein the at least one first interconnection level is configured to provide routing at least between the first memory elements, wherein the plurality of first memory elements are positioned in a first region of the circuit, and the plurality of filament switching resistive memory elements are positioned in a second region of the circuit, there being no overlap between the first and second regions.

10. The memory circuit of claim 9, further comprising at least one interconnection level comprising:

in a region aligned with the first region, routing tracks that are dedicated to the first memory elements; and in a region aligned with the second region, routing tracks that are dedicated to the filament switching memory elements.

11. A method of fabrication of a resistive memory circuit comprising:

forming a transistor layer of the resistive memory circuit;

forming, in a first region of the circuit, a plurality of first memory elements in first level above the transistor layer;

forming at least one first interconnection level;

forming, in the first region of the circuit, a plurality of filament switching resistive memory elements in a second level higher than the first level; and forming at least one second interconnection level, wherein:

the at least one first interconnection level separates the first and second levels and is dedicated to the routing of the first memory elements; and the at least one second interconnection level separates the first and second levels or is higher than the second level, and is dedicated to the routing of the filament switching resistive memory elements.

* * * * *